(12) United States Patent
Kanakasabapathy et al.

(10) Patent No.: US 9,929,016 B2
(45) Date of Patent: *Mar. 27, 2018

(54) MATERIAL REMOVAL PROCESS FOR SELF-ALIGNED CONTACTS

(71) Applicant: International Business Machines Corporation, Armonk, NY (US)

(72) Inventors: Sivananda K. Kanakasabapathy, Niskayuna, NY (US); Ahmet S. Ozcan, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/679,433

(22) Filed: Aug. 17, 2017

(65) Prior Publication Data

US 2017/0345659 A1 Nov. 30, 2017

Related U.S. Application Data

(63) Continuation of application No. 14/969,708, filed on Dec. 15, 2015, now Pat. No. 9,761,455.

(51) Int. Cl.
| | |
|---|---|
| *G01R 31/26* | (2014.01) |
| *H01L 21/66* | (2006.01) |
| *H01L 21/263* | (2006.01) |
| *H01J 37/304* | (2006.01) |
| *H01J 37/30* | (2006.01) |
| *H01L 21/768* | (2006.01) |
| *H01L 21/762* | (2006.01) |
| *H01L 29/66* | (2006.01) |
| *H01L 29/78* | (2006.01) |

(52) U.S. Cl.
CPC ........ *H01L 21/2633* (2013.01); *H01J 37/304* (2013.01); *H01J 37/3005* (2013.01); *H01L 22/12* (2013.01); *H01L 21/76224* (2013.01); *H01L 21/76897* (2013.01); *H01L 29/66795* (2013.01); *H01L 29/785* (2013.01)

(58) Field of Classification Search
CPC ......... H01L 29/66795; H01L 21/26513; H01L 21/26566; H01L 21/2633
See application file for complete search history.

(56) References Cited

U.S. PATENT DOCUMENTS

| | | |
|---|---|---|
| 8,193,094 B2 | 6/2012 | Wang |
| 9,530,665 B2 | 12/2016 | Leobandung et al. |
| 2014/0084383 A1* | 3/2014 | Cai .................. H01L 29/66545 257/401 |
| 2015/0129939 A1 | 5/2015 | Alptekin et al. |

* cited by examiner

*Primary Examiner* — Zandra Smith
*Assistant Examiner* — John M Parker
(74) *Attorney, Agent, or Firm* — Cantor Colburn LLP

(57) ABSTRACT

A method is disclosed of removing a first material disposed over a second material adjacent to a field effect transistor gate having a gate sidewall layer that comprises an etch-resistant material on a gate sidewall. The method includes subjecting the first material to a gas cluster ion beam etch process to remove first material adjacent to the gate, and detecting exposure of the second material during the gas cluster ion beam (GCIB) etch process.

1 Claim, 6 Drawing Sheets

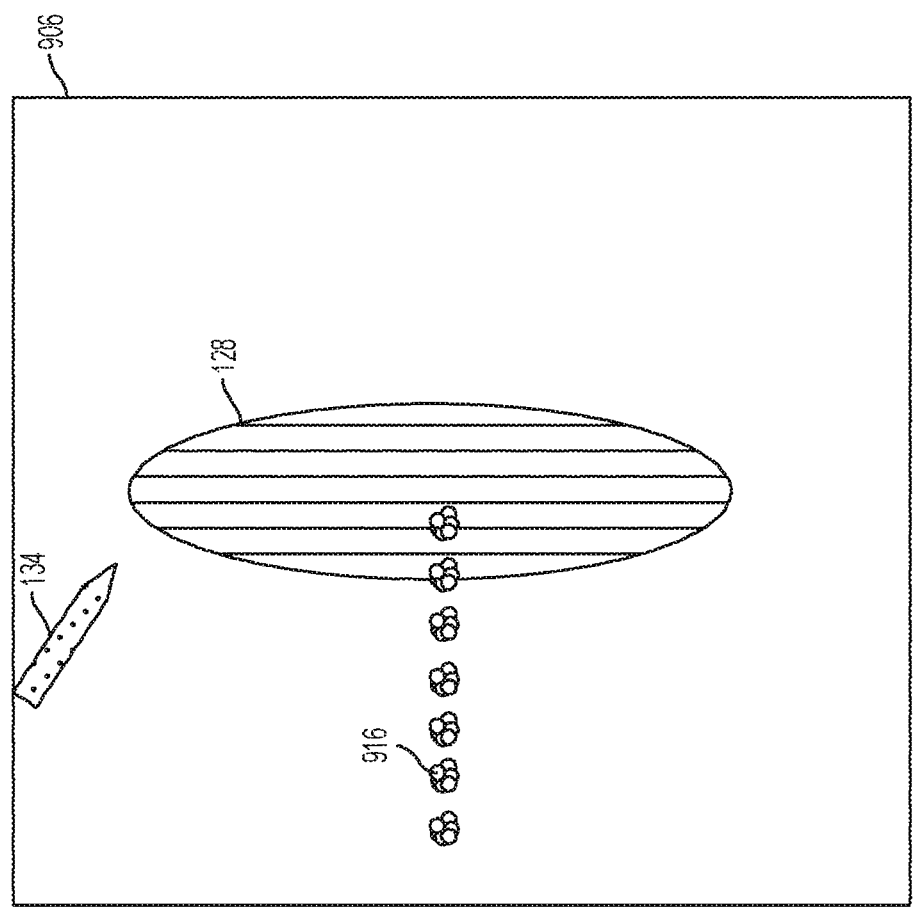

MATERIAL REMOVAL PROCESS FOR SELF-ALIGNED CONTACTS

DOMESTIC PRIORITY

This application is a Continuation of Non-Provisional application Ser. No. 14/969,708, entitled "MATERIAL REMOVAL PROCESS FOR SELF-ALIGNED CONTACTS," filed Dec. 15, 2015 which is incorporated herein by reference in its entirety.

BACKGROUND

The present invention relates to field effect transistors (FET's), and more specifically, to material removal techniques for forming self-aligned contact openings for field effect transistors.

Semiconductor devices such as FETs, MOSFET's (metal oxide semiconductor FET's), and FinFET's (fin-type FET's) are typically fabricated in sequential processes involving steps materials of different types are deposited or grown, and steps where materials of different types are removed. For example, material is typically removed to form FET contact openings. Various types of material removal processes have been used, such as chemical etching, plasma etching, or reactive ion etching (RIE).

In the past, removal of material for contact openings was dimensionally controlled through conventional masking techniques. With such techniques, a mask could be disposed over portions of the device where material removal was not desired, for example by exposing and curing a soft photoresist mask and removing unexposed areas with solvent or by selectively depositing a hard mask material. A material removal process such as the above-described processes would then be applied through the openings in the mask to remove the underlying material.

More recently, as semiconductor device density has increased, with a concomitant decrease in component sizing and spacing, limitations were reached in the capability of conventional masking techniques to provide accurate registration matching with smaller and more tightly spaced structures beneath the mask. This led to the development of self-aligning technologies such as self-aligned contact (SAC) etching. In a self-aligned contact etch process, adjacent gate structures are provided with an etch-resistant material on the gate sidewall, which prevents etching of the gate itself in the event of mis-alignment of the mask opening edges with the interface between the material removal area and the gate. In the SAC etch process, a material removal technique is used that is selective between the material to be removed and the etch-resistant material on the gate sidewall.

SUMMARY

According to an embodiment of the present invention, a method is provided of removing a first material disposed over a second material adjacent to a field effect transistor gate comprising a gate sidewall layer that comprises an etch-resistant material on a gate sidewall. The method comprises subjecting the first material to a gas cluster ion beam etch process to remove first material adjacent to the gate, and detecting exposure of the second material during the gas cluster ion beam (GCIB) etch process.

BRIEF DESCRIPTION OF THE DRAWINGS

FIGS. 5A and 5B each schematically depict an exemplary embodiment of deployment of a detector in an exemplary embodiment of the above-described method.

DETAILED DESCRIPTION

Figure 1:
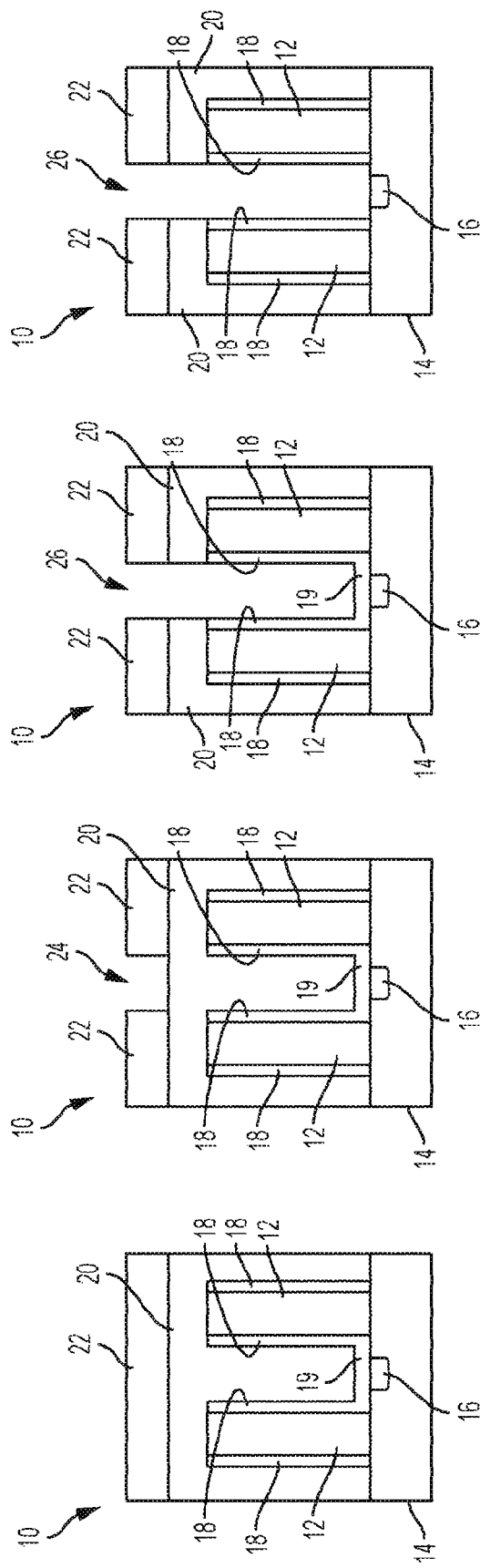
FIGS. 1A, 1B, 1C, and 1D each sequentially depict an exemplary embodiment of a FET gate structure subjected to a material removal process.

With reference now to FIGS. 1A-1D, an exemplary embodiment of material removal adjacent an exemplary FET gate structure is schematically depicted. As shown in FIGS. 1A-1D, an intermediate semiconductor device structure 10 is ready for material removal for opening gate contacts. In the structure 10, gates 12 are disposed on substrate 14. Depending on the application for which the FET is intended, the gates can have various different internal structures formed from various materials. In some exemplary aspects, the gates 12 can be patterned from a stack of materials including a thin layer of gate dielectric such as $HfO_2$, a gate conductor such as metal (e.g., aluminum or tungsten) or doped polysilicon on top of the gate dielectric, and optionally a gate hard mask such as silicon nitride on top of the gate conductor. The substrate 14 can be formed from a variety of semiconductor materials, including but not limited to polysilicon, silicon-germanium, silicon carbide, indium, or gallium. In the exemplary embodiment of FIGS. 1A-1D, region 16 of the substrate 14 is doped to provide electrical conductivity to serve as a source/drain region, although other source/drain configurations such as a raised source/drain can also be utilized. It should be noted that although FIG. 1A shows an already formed source/drain region 16 as is commonly practiced, doping of the substrate 14 can also be effected after formation of the contact opening before subsequent deposition of the contact material (not shown). Sidewall spacers 18 disposed on the sidewalls of the gates 12 can be formed from an etch-resistant material such as SiN, SiBCN, SiOCN, SiOC, and other dielectrics formed from oxides and nitrides of silicon. and thus serve as the above-described etch-resistant material for the gate sidewall layer. Alternatively, the sidewall spacers 18 can be formed from a non-etch resistant dielectric material such as silicon dioxide and be covered with a layer of etch-resistant material such as titanium nitride. Although not required, in the exemplary embodiment shown in FIGS. 1A-1C, the etch resistant material is also disposed on the substrate 14 as etch stop layer 19 across the space between the gates 12. As shown in FIGS. 1A and 1B, the gates 12 are surrounded by an etchable interlayer dielectric material 20 such as borophosphosilicate glass or phosphosilicate glass. Mask layer 22 can be a soft photoresist mask or a hard mask such as a hard oxide or nitride material.

In FIG. 1B, the mask layer 22 is patterned to provide an opening 24 over the area from which material is to be removed. In the embodiments depicted in FIGS. 1A and 1B, the opening is formed lithographically in a continuous soft mask layer by exposing a photoresist material to cure it in areas other than the mask opening 24 followed by solvent washing to remove uncured photoresist. Alternatively, in the case of a hard mask, the hard mask is deposited in the patterned configuration of FIG. 1B, bypassing the need for a configuration as shown in FIG. 1A. It should be noted that in FIG. 1B, the mask opening 24 is depicted as precisely aligned with the space between the gates 12 from which material is to be removed, but in many cases there would be some misalignment that would be compensated for by self-aligned contact (SAC) techniques where an etch-resistant material on the gate sidewalls prevents unwanted etching of either of the gates 12 in any area of overlap of the gate 12 and the mask opening 24.

In FIG. 1C, etch processing is applied through the mask opening 24 as represented by arrow 26 to remove the interlayer dielectric material 20. This etch processing can be a gas cluster ion beam etch process, with detection employed to identify exposure of the etch stop layer 19, or exposure of source/drain 16 if etch stop layer 19 is not present. In embodiments where etch stop layer 19 is present, the interlayer dielectric material 20 can alternatively be removed down to the etch stop layer 19 by other etching processes such as chemical etching, reactive ion etching (RIE), or plasma etching (e.g., oxygen plasma etching), and gas cluster ion beam etching can be used to remove etch stop layer 19 as shown in FIG. 1D. Although not required in all embodiments, GCIB etching can offer advantages in some embodiments by avoiding lag issues that can occur with other etching technologies such as ME, and is also directional so that it can be used for contact opening in a wide variety of device configurations.

In a gas cluster ion beam process, a surface is bombarded by a beam of high-energy gas phase atomic clusters. The clusters are formed when a high pressure gas (e.g., 10 atmospheres) is supersonically expanded into a vacuum (e.g., $10^{-6}$ torr to $10^{-5}$ torr), where it cools and condenses into weakly ionized clusters. The ionized clusters are electrostatically accelerated to high velocities and focused into a beam that impacts the target surface. GCIB can be used for various applications such as film deposition, surface modification, or etching. Source gases for GCIB etching include various halogen gases, including but not limited to $NF_3$, $SF_6$, $F_2$, $Cl_2$, $Br_2$, and various halogen-substituted methanes substituted with 1 to 3 halogen atoms. Although not required in all embodiments, GCIB etching can offer advantages in some embodiments by avoiding lag issues that can occur with other etching technologies such as RIE, and is also directional so that it can be used for contact opening in a wide variety of device configurations.

As mentioned above, GCIB etching is used to remove a first material adjacent to a FET gate while detecting for exposure of a second material under the first material. Although not required in all embodiments, in some embodiments such active detection can avoid over-etching into underlying materials for which GCIB etch processing may lack selectivity such as for conductive materials or underlying doped or undoped substrate (e.g., Si, SiGe). Detection of exposure of an underlying second material can be accomplished by optical sensing or by chemical sensing. Optical sensing can be used when the underlying second material has different optical properties than the overlying first material. Chemical sensing can be performed by spectroscopy performed on gas in the GCIB process chamber where the gas cluster ion beam contacts the target material. Examples of spectrometers that can be used for chemical sensing include a quadrupole mass spectrometer residual gas analyzer (RGA) or a microplasma emission spectrometer (MPES).

Figure 2:
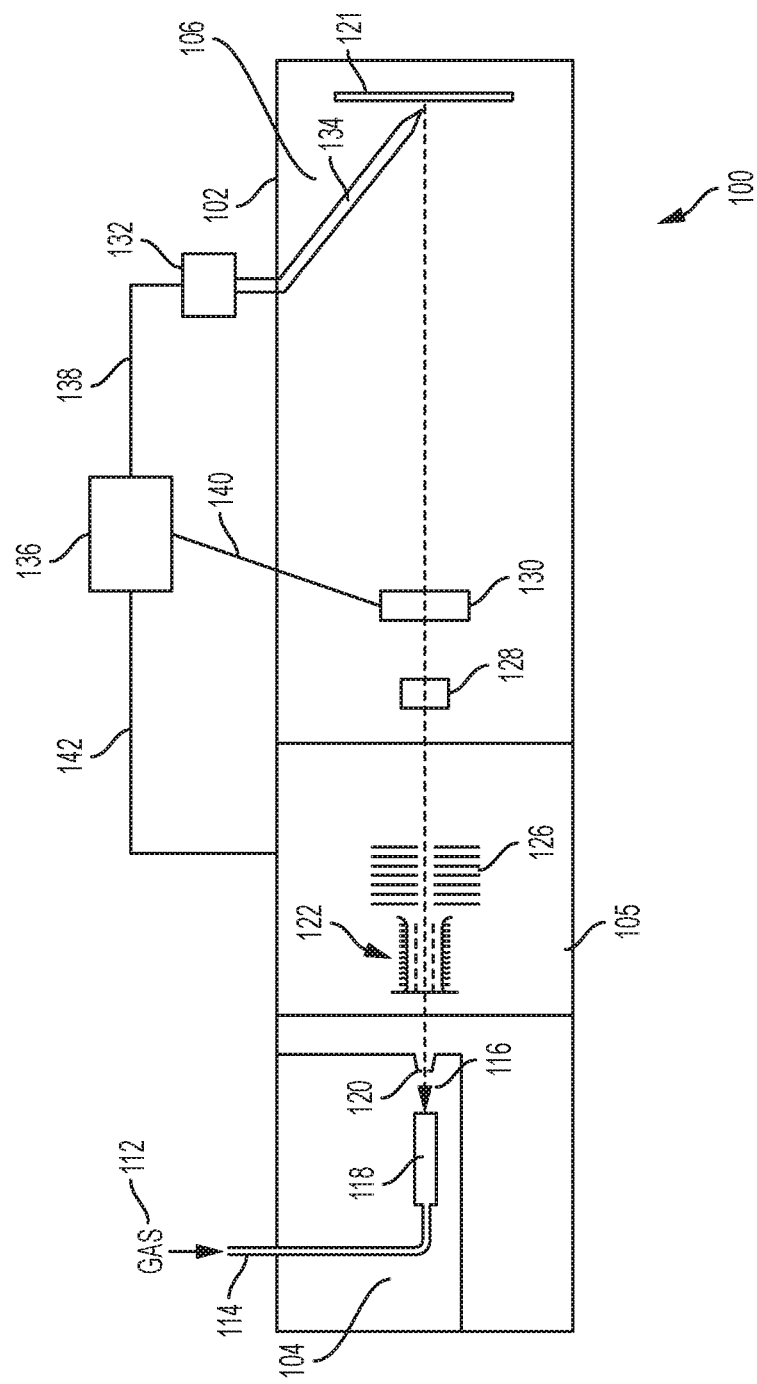
FIG. 2 schematically depicts an exemplary embodiment of a GCIB apparatus for carrying out the above-described method.

An exemplary embodiment of a GCIB apparatus 100 is schematically depicted in FIG. 2. As shown in FIG. 2, a vacuum vessel 102 has a cluster formation 104, an ionization/acceleration chamber 105, and a processing chamber 106. Although not required, a differential vacuum pumping system (not shown) can be utilized to maintain different pressures in the different chambers (e.g., a pressure of $10^{-6}$ torr to $10^{-5}$ torr in the ionization in the ionization/acceleration chamber 105 and a pressure of $10^{-5}$ torr to $10^{-3}$ torr in the processing chamber 106). A source gas 112 is introduced through a gas feed tube 1914. Gas clusters 116 are formed by creating a supersonic jet of source gas through a nozzle 118 into the source chamber 104.

Cooling resulting from the expansion causes the gas to condense into clusters of, for example, from several to several thousand atoms or molecules. A gas skimmer aperture 120 defines a size of the beam of gas clusters 116 as it moves downstream toward target 121. After the cluster beam has been formed, the clusters 116 are ionized in an ionizer 122. The ionizer 122 can be an electron impact ionizer that produces thermoelectrons from one or more incandescent filaments and accelerates and directs the electrons causing them to collide with the gas clusters 116 in the gas cluster beam where it passes through the ionizer 122. The electron impact ejects electrons from the clusters, causing the clusters to become positively ionized.

Accelerator 126 utilizes a series of electrodes to accelerate the beam to a desired energy, for example, from 1 keV to several tens of keV. The accelerated beam is directed at a substrate 128 for GCM processing. A mass selector 128 can optionally be utilized for selecting clusters of a certain mass or within a certain range of masses. Such a mass selector 128 can be, for example, a weak transverse magnetic field for deflecting monomer ions and other light ions (e.g., those cluster ions of ten or fewer atoms or molecules) out of the beam and passing more massive cluster ions. A beam gate 130 is disposed along beam path, allowing the gas cluster ion beam to be interrupted in response to directions from controller 136.

Figure 3:
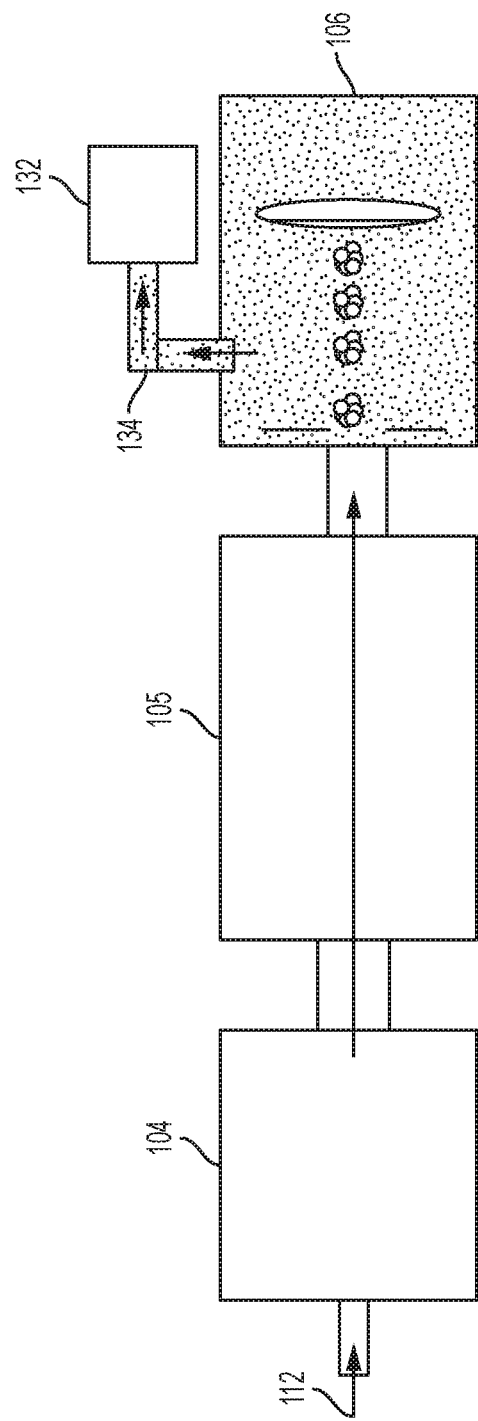
FIG. 3 schematically depicts an exemplary embodiment of another GCIB apparatus for carrying out the above-described method.

With continued reference to FIG. 2, detector 132 is connected to probe 134 for detecting exposure of the second material underlying the first material as described above. As used herein, a "probe" can mean a conduit for sampling gas and transporting it to the detector 132 or an optical probe for sensing an optical property of the etch target. In some embodiments where detector 132 is a spectrometer such as a quadruple mass spectrometer residual gas analyzer (RGA), the spectrometer operates in a lower pressure range (e.g., $10^{-10}$ torr to $5 \times 10^{-4}$ torr) than the pressure in the process chamber 106 (e.g., $10^{-5}$ torr to $10^{-3}$ torr). In such cases, the detector 132 can be maintained at a lower pressure than the process chamber by differential pumping with one or more orifices between the gas sampling location and the detector 132 sized to maintain the pressure differential. FIG. 2 depicts an embodiment where gas can be collected or optical measurements taken by a probe 134 located proximate to the intersection of the gas cluster ion beam and the etch target 121 in the processing chamber 106. Such an embodiment allows for localized detection to be performed at the chip site on a semiconductor wafer. In an alternative embodiment where such localized detection is not needed or desired, detection can be performed at a non-localized (wafer) level, with a probe 134 located remote from the etch target 121 such as at or near the periphery of the processing chamber 106, as shown in FIG. 3.

Referring again to FIG. 2, controller 136 is operatively connected to detector 132 as represented by connection 138, to beam gate 130 as represented by connection 140, and to other system components as represented by connection 142. Any or all of these connections can be wired or wireless, and other connections can be established to any other system components not illustrated herein. Additionally, the controller 136 can be a single controller or a plurality of interconnected controllers. In some embodiments, the method further comprises, and the controller 136 can be configured to, terminate the gas cluster ion beam etch process in response to detecting exposure of the second material under the first material. In some embodiments, the method further comprises, and the controller 136 can be configured to, determine an amount of time required for the gas cluster ion beam etch to remove the first material and expose the second material based on said detecting exposure of the second material.

Figure 4:
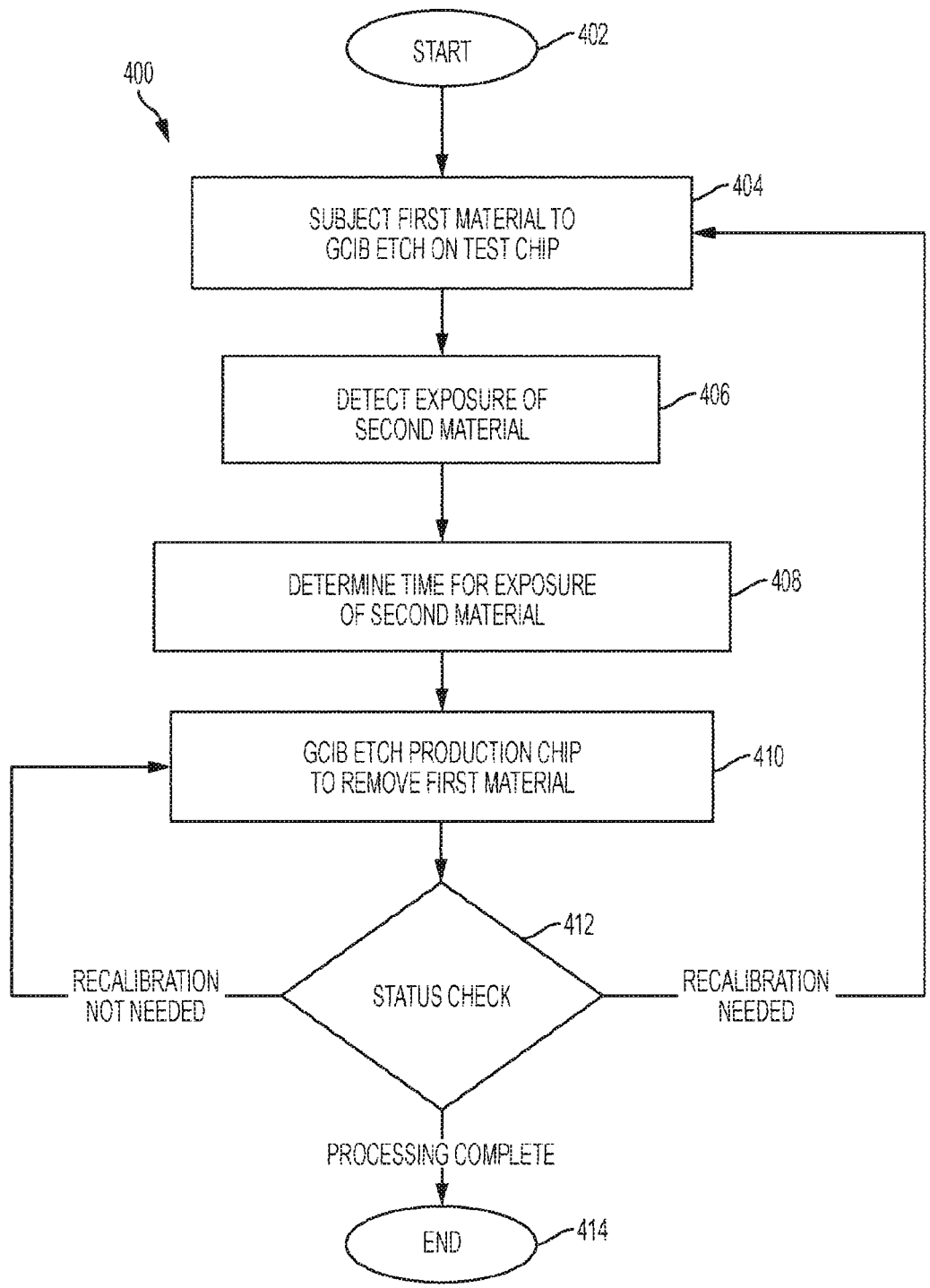
FIG. 4 is a flowchart illustrating an example embodiment of a method of GCIB etching of material adjacent to gate structures on semiconductor wafer.

In some embodiments, the methods described herein can be performed on a semiconductor device wafer that includes a plurality of gates. Although it is not required, in such embodiments an etch duration (i.e., an amount of time) can be determined for removal of the first material and exposure of the second material and etch-removal of first material can be performed adjacent to one or more additional gates based on the determined etch duration without the need for active detection of exposure of the second material. A non-limiting example embodiment of a such a method is schematically depicted in FIG. 4. Referring now to FIG. 4, from the start (block 402), the etch target 121 is subjected in block 404 to GCIB etching for removal of first material. In some such embodiments, the etch target 121 can be material adjacent to a gate 12 (FIGS. 1A-1D) on a semiconductor device wafer and the etch duration can be determined on a test chip on the wafer. Although it is not required, in some embodiments, the test chip can be located near the periphery of the wafer, as such chips are well-suited for test purposes as they are often only partially printed and therefore not configured to be operational. In some embodiments, the test chip area subjected to GCIB processing can be 1 cm$^2$ to 2 cm$^2$, and can include a number of gates. In block 406, exposure of a second material under the first material is performed using techniques such as those described above. In block 410, another gate (e.g., on a production chip) in addition to the gate where detection was performed can then be etched based on the determined etch duration. A status check is performed in block 412 to determine whether recalibration is needed on another test chip, or if recalibration is not needed, or if processing has been completed. If recalibration is needed, the process loops to block 404. The determination of whether recalibration is needed can be based on various protocols, for example based on a timer tracking cumulative GCIB etching time or a count timer tracking a number of gates processed, or on a programming determination that all gates of a particular configuration on the wafer have been processed. If recalibration is not needed, the process loops to block 410 for GCIB etching on additional production chips, and the controller 136 can be configured accordingly for carrying out such a method, with repositioning of the gas cluster ion beam to different locations accomplished by repositioning target 121 with a positioning mechanism (not shown) in response to direction from the controller 136. In this fashion, a number of additional gates on the wafer can be processed, with optional periodic etching of additional test chips during GCIB etch processing of the wafer, for example, to periodically check calibration. This approach can offer significant efficiency advantages by avoiding the necessity of detecting exposure of the second material for each chip on the wafer. It should be noted however, that such advantages are not necessary for all embodiments, and that some embodiments may not provide this advantage. If the status check in block 412 determines that all gates on the wafer designated for GCIB etching have been processed, the process ends at block 414.

Figure 5A:
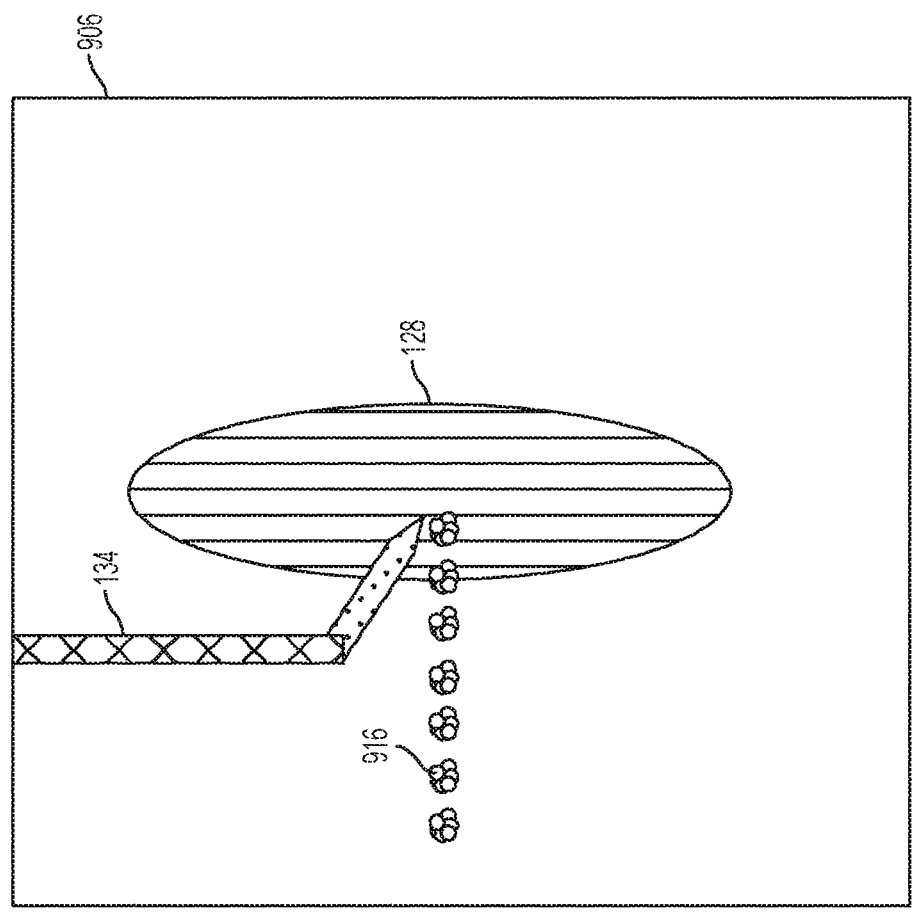

In some embodiments, the method comprises positioning the probe 134, and the controller 136 is configured to position the probe 134, proximate to the point of intersection between the gas cluster ion beam and the target 121 during detection of exposure of the second material on a test gate or a test chip. The probe 134 is repositioned to a position remote from the point of intersection during gas cluster ion beam etching of the first material adjacent to additional gate or gates where etch is performed for a determined duration based on detection of exposure of the second material on the test gate(s) or test chip(s). Positioning of the probe 134 can be effected by an electromechanical mechanism (not shown). Such an embodiment is depicted in FIGS. 5A and 5B, where FIG. 5A depicts the probe 134 in a position proximate to from the point of intersection during gas cluster ion beam etching for detection of exposure of the second material on a test gate or a test chip, and FIG. 5B depicts the probe 134 position remote from the point of intersection during gas cluster ion beam etching of the first material adjacent to additional gate or gates where etch is performed for a determined duration.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor device, the method comprising:
   subjecting a first material to a gas cluster ion beam etch process to remove the first material, the first material disposed over a second material and adjacent to a field effect transistor gate comprising a gate sidewall layer that comprises an etch-resistant material on a gate sidewall; and
   detecting exposure of the second material during the gas cluster ion beam etch process, wherein detecting exposure of the second material comprises sensing removal of the second material by the gas cluster ion beam etch process, wherein detecting exposure of the second material comprises sensing removal of the second material by spectroscopy.

* * * * *